United States Patent [19]

Doty, Jr. et al.

[11] 4,225,957
[45] Sep. 30, 1980

[54] TESTING MACROS EMBEDDED IN LSI CHIPS

[75] Inventors: Charles R. Doty, Jr., Matthews, N.C.; Eugen I. Muehldorf, Potomac, Md.; Himanshu G. Shah, Lexington, Ky.

[73] Assignee: International Business Machines Corporation, Armonk, N.Y.

[21] Appl. No.: 951,891

[22] Filed: Oct. 16, 1978

[51] Int. Cl.² .................. G01R 31/28; G06F 11/00
[52] U.S. Cl. ................................. 371/15; 324/73 R; 371/25
[58] Field of Search .............. 235/302; 324/73 R; 364/716; 307/207

[56] References Cited

U.S. PATENT DOCUMENTS

| | | | |
|---|---|---|---|
| 3,761,695 | 9/1973 | Eichelberger | 235/302 |
| 3,783,254 | 1/1974 | Eichelberger | 364/700 |
| 3,784,907 | 1/1974 | Eichelberger | 324/73 R |
| 3,961,251 | 6/1876 | Hurley et al. | 324/73 AT |
| 3,961,252 | 6/1976 | Eichelberger | 324/73 AT |
| 3,961,254 | 6/1976 | Cavaliere et al. | 324/73 AT |
| 4,051,353 | 9/1977 | Lee | 364/716 |
| 4,058,767 | 11/1977 | Muehldorf et al. | 324/73 R |
| 4,063,080 | 12/1977 | Eichelberger et al. | 235/302 |
| 4,074,851 | 2/1978 | Eichelberger et al. | 235/302 |

OTHER PUBLICATIONS

Muehldorf and Williams, Embedded Macro Test Pattern Generation, IBM Tech. Disclosure Bulletin, vol. 20, No. 1, Jun. 1977, pp. 197–199.

Abramson et al., Reduced Fault Testing for Array Logic Board, IBM Tech. Disclosure Bulletin, vol. 21, No. 7, Dec. 1978, pp. 2678–2679.

*Primary Examiner*—Charles E. Atkinson
*Attorney, Agent, or Firm*—Maurice H. Klitzman

[57] ABSTRACT

Testing combinatorial logic sectioned into macros. The macros perform functions some of which are linear, such as busses, and some of which are non-linear such as PLAs, with the macros being connected so that the total chip can be tested by testing each macro individually to thereby make it unnecessary to model the totality of the macros collectively in terms of primitive logic.

7 Claims, 5 Drawing Figures

TESTING MACROS EMBEDDED IN LSI CHIPS

FIELD OF THE INVENTION

This invention relates to semiconductor devices so designed and arranged as to facilitate testing them, and more particularly, with large scale integrated (LSI) chips, having embedded therein testable combinatorial logic embodied as macro structures.

DISCUSSION OF THE PRIOR ART

For purposes of this invention, the term "embedded" is intended to mean that condition of a group of circuit elements, when surrounded by other circuitry on the chip, which circuit elements are not directly accessible, either in whole or in part, from the input and output terminals or pads on the chip.

In designing LSI chips there are four essential competing disciplines that must be reckoned with; (1) logic design, (2) physical design, (3) test pattern generation, and (4) release to manufacturing. For instance, like the requirement to design logic structures capable of being manufactured efficiently, logic structures should also be designed for the sake of efficient testability as in item (3) above. It was in this context that the patents to Eichelberger U.S. Pat. Nos. 3,783,254 and 3,761,695, assigned to the same assignee as this application, applied the constraint for designing combinatorial logic so that it could be partitioned for testing in LSSD (Level Sensitive Scan Design).

However, when designed for efficient physical layout, as in item (2) above, the logic structures are partitioned in such a manner that the combinatorial logic is described by macros, predominantly PLAs, resulting generally in one PLA feeding another PLA. PLAs can be tested in a unit logic sense by modelling the PLA as blocks of unit logic. However they are more efficiently testable in a macro sense. For purposes of this invention, a macro is intended to cover those groups of circuit elements or devices which are arranged in a particular physical arrangement, according to the logic function desired to be carried out, and the designer dictates the logic function desired so as to give personality to the device, such as a PLA. In this sense, one macro can perform one of many specific logic functions depending on the personality desired for the macro.

In contrast with macros, unit logic is intended to cover single logic gates from which a macro can be built. In this sense, a PLA can be referred to as a macro built from pieces of unit logic. Thus, PLAs are always testable in a unit logic sense because a PLA can be modelled in terms of its unit logic for which pattern generators can generate test patterns. However, as density increases, which is reflected in an increasing number of single logic gates in the model, more computer power is required to carry out pattern generation and modelling.

A problem with prior art attempts to model PLAs is that when one partitions large portions of combinatorial logic into PLAs, then generally it results in one PLA feeding another PLA. This is because a PLA performs a certain logic function. In a PLA, one can concentrate several logic inputs to produce one or two outputs based on these logic inputs in a very effective manner. The outputs can be used as control lines into a second PLA for channeling other functions. By connecting the PLAs in series, the efficiency gained is that the first and second PLAs are very efficiently personalized. However, PLAs are not efficiently partitionable so as to be testable in a macro mode.

Stated another way, PLAs could be implemented in parallel, but this is like having a single PLA. In such case, the PLA becomes less efficiently personalized and significant space can be lost. Thus the obvious solution utilized by the prior art has been to have one PLA feeding another PLA in order to maintain high efficient personalization, and modelling the resulting structure in terms of single logic gates for the purpose of test pattern generation.

If one wishes to test PLAs as a macro, then it is generally not possible to generate a macro test pattern for the first PLA, such that the output resulting from the test pattern would propogate undistorted through the second PLA.

(See IBM Technical Disclosure Bulletin, Vol. 20, No. 1, June 1977, p. 197). This is because a trait of any PLA is that in general its combinatorial logic is non-linear and as a corollary, in general, some test patterns required for the second PLA, cannot be propogated through the first PLA in an undistorted manner. Thus, patterns for combinations of PLAs can only be generated for both PLAs if all logic is modelled for purposes of test pattern generation by primitives (AND, OR, NAND, NOR). As mentioned previously, this requires large computing power because of the large number of primitive blocks used in the modelling process. In addition, high fan-in and fan-out complicates the computing process.

The prior art, like the Eichelberger patents, disclosing testing in LSSD, has recognized that test pattern generation requirements can place reasonable constraints on logic designs so as to make testing easier. However, it has not been recognized as to what some of these design constraints could be other than unit logic constraints.

SUMMARY OF THE INVENTION

It is therefore an object of the invention to not only put a constraint on designers to design combinatorial logic in a macro sense, but also to test it in a improved macro mode as opposed to testing it in a unit logic mode.

It is another object of the invention to include PLAs in a combinatorial logic structure and partition it in such a manner that the PLAs are efficiently testable in an improved manner in other than a unit logic mode.

Since PLAs are a cumbersome inefficient way of implementing bus switching capability, the above objects are carried out by providing an architecture which consists of a plurality of PLAs and busses as the combinatorial logic, with the PLAs being connected in such a manner that only the bus inputs may be connected in series to the outputs of one or more of the PLAs. The PLAs appear in a mutually parallel configuration for testing by including latches which may have no actual logic function but may on occasion be used for the purpose of testing. Such latches merely perform a pass through function, i.e., a delay. In addition, no reconvergent fan-outs are permitted for PLAs, i.e. where inputs are in common, the outputs are mutually exclusive from one another, for example, if the inputs are connected together the outputs are not connected together, or if the outputs are connected together the inputs are not connected together.

Other arrangements considered to be within the scope of the invention are structures where linear logic functions appear in place of the busses, such as exclusive-OR gates, decoders or code converters for bus switching between the PLAs and the output.

For purposes of this invention the term linear is intended to mean that the output response is a one-to-one mapping of the input patterns, i.e. for each unique input pattern there is a unique output pattern in a binary sense. To illustrate further, if two input patterns such as:

| | |
|---|---|
| 1 | 0 |
| 1 | 1 |
| 1 | 0 | provides two output patterns such as:

| | |
|---|---|
| 1 | 0 |
| 0 | 0 |
| 1 | 1 | then the input patterns are uniquely mapped into the output patterns. However, if two input patterns are:

| | |
|---|---|
| 0 | 1 |
| 1 | 0 |
| 0 | 0 | and the corresponding output patterns are:

| | |
|---|---|
| 0 | 0 |
| 0 | 0 |
| 0 | 0 | then the input patterns are not uniquely mapped into the output patterns because the two output patterns are the same for the two different input patterns and thus do not retain the unique characteristics of the input patterns.

However, it should be noted, that a bus is not essentially linear, but is non-linearity is of such a nature that it can be controlled similar to linear devices, since the bus is an on-off switch, because when the bus is on, it performs a linear signal pass-through function, and when it is off, it blocks the pathways of signals. Thus, the test patterns can be generated for busses and present no difficulty as do other non-linear devices. The PLA patterns will propogate through the bus in the on state with the one-to-one mapping preserved. In addition, since busses are a simple logic structure, PLA test pattern responses, which appear at the output of the PLA, can be used as test patterns for the bus. The advantage in combining bus switching with PLAs is that you can generate a test pattern for the PLAs which can also simultaneously perform testing of the bus.

GENERAL DESCRIPTION

Figure 1:
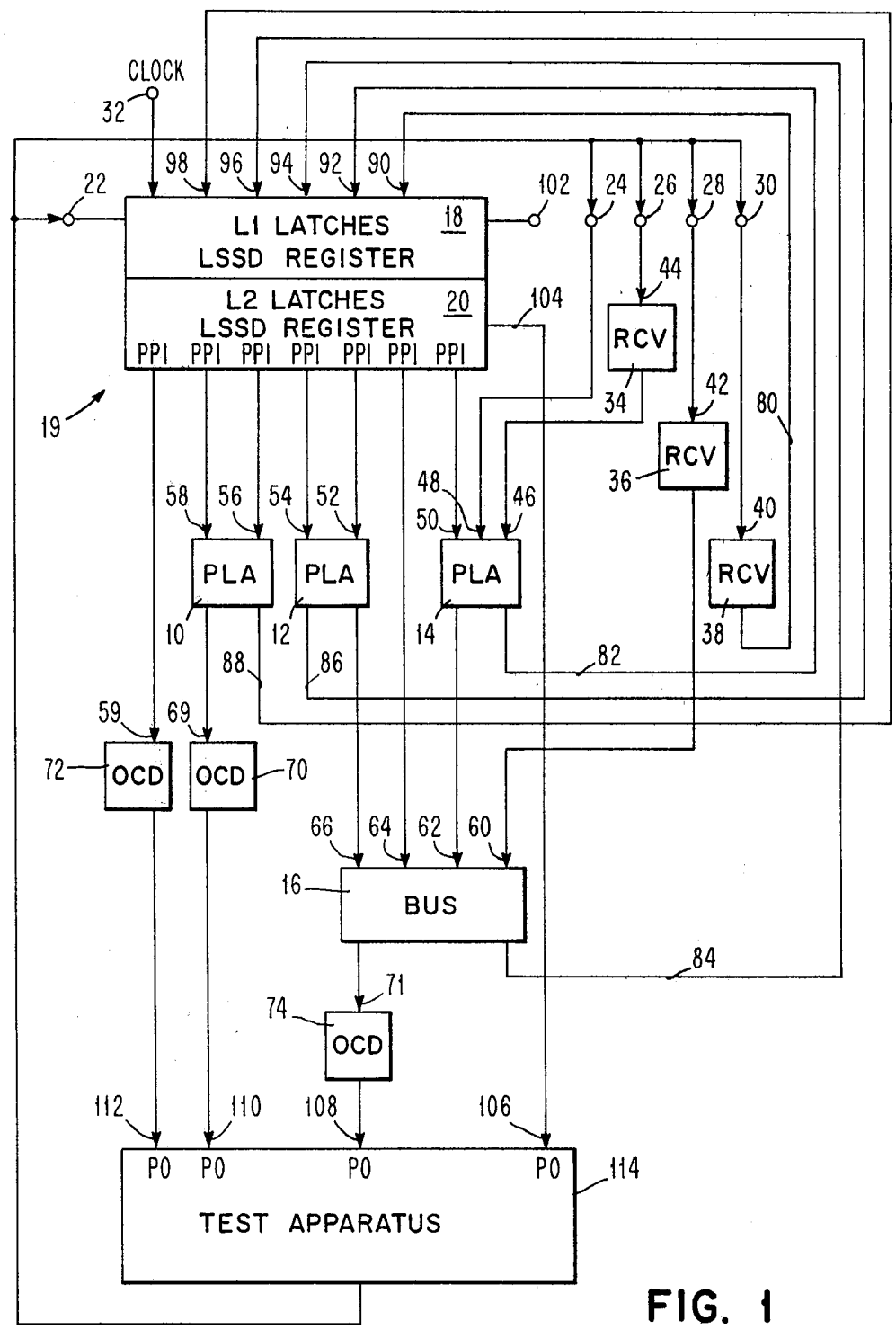
FIG. 1 shows an organization of a typical logic configuration for testing PLAs, employing the principle of the invention.

Reference is made to FIG. 1 which shows a typical configuration of a logic design in accordance with this invention in the testing mode as opposed to its normal logic functioning mode. The logic is built in such a way that by application of a control signal it is put into a testing mode, where all latches are connected together to function as a shift register, as described by the principle of LSSD. What we have done is taken the combinatorial logic shown in LSSD and have structured it with PLAs. In order to be efficient, in many cases, PLAs will be serially connected which makes it impractical for testing in a macro sense. In these situations, latches having no logic function are placed between the PLAs. In a testing mode, these latches will become members of an LSSD shift register. It is to be noted that latches need not be included between PLAs and other logic which is either a bus or linear logic device because the expected responses will propogate through the linear logic on a one-to-one mapping basis to thus test the PLA. In the testing mode shown, three PLAs 10, 12, and 14 are arranged in parallel and embedded in an LSI chip. Although three PLAs are shown, it is recognized that the invention is equally applicable to two or a greater number than three. Also, a data bus 16 is provided. Again, a plurality of busses may be utilized in the general case.

In order to test the PLAs 10, 12, and 14 and the data bus 16 in a macro sense as opposed to a unit logic sense, an LSSD shift register 19 is shown divided into two separate sets of LSSD latches 18 and 20 which operate in an LSSD mode as described in the patents to Eichelberger U.S. Pat. Nos. 3,783,254 and 3,761,695 and assigned to the same assignee as this application. The bus macro 16 of a set of AND gates. When a test pattern fills register latches 18, their contents is transferred in parallel into L2 latches 20 at a timed interval by a clock pulse at terminal 32. By providing a clocking arrangement between L1 latches 18 and L2 latches 20, racing of the pattern through the logic consisting of the PLAs 10, 12 and 14 and bus 16 and L1 latches 18 is rendered harmless, because the patterns must reach a steady state before they are clocked into L2 latches 20. To test the PLAs, a test pattern stored in testing apparatus 114 is scanned in series into the LSSD latches 18 through scan-in terminal 22.

Simultaneously, with clocking the test pattern from the L1 latches 18 into the L2 latches 20, another portion of the test pattern stored in test apparatus 114 is fed in parallel into terminals 24, 26, 28 and 30 with the input at terminal 24 being fed into PLA 14 at terminal 48, the input at terminal 26 being fed into receiver 34 at terminal 44 and then fed into PLA 14 at terminal 46, the input at terminal 28 being fed into receiver 36 at terminal 42 and fed into data bus 16 at terminal 60, and the input at terminal 30 being fed into receiver 38 at terminal 40 which is fed back into the L1 latches 18 at terminal 90. The test pattern contained in the L2 latches 20 provide inputs into pseudo primary terminals 50, 52, 54, 56, 58, 59 and 64. The pattern at terminals 46, 48, and 50 propagates through PLA 14 and provides an output on line 82 which is fed as a pseudo primary output back into one of the L1 latches 18 at terminal 92. In a similar fashion, the pattern propagates into the data bus 16 at terminals 60, 62, 64, and 66 and propagates through the data bus to provide an output on line 84, so as to provide a pseudo primary output which feeds back into one of the latches 18 at terminal 94. Similarly, the signals at pseudo primary terminals 52 and 54 inputs into PLA 12 which likewise provides a pseudo primary output on line 86 which feeds back into the one of L1 latches 18 at terminal 96.

With respect to PLA 10, the response propagates out through the primary output line 88 and feeds back into one of the L1 latches 18 at terminal 98. After the test patterns have propagated through the PLAs 10, 12, and 14 and bus 16, and having produced responses which are stored in the L1 latches 18, a clocked timing pulse is provided on terminal 102 so as to clock the results out onto line 104 to be scanned out at terminal 106 into a testing apparatus 114, the details of which are well-known in the prior art and form no part of this invention. Each set of response patterns from the pseudo primary outputs propagate into test apparatus 114 where they are held for comparison purposes with an expected response. Off-chip drivers 70, 72, and 74 receive primary outputs from the data bus 16, PLA 10, and L2 latches 20 at terminals 69, 59 and 71, respectively. The outputs from these off-chip drivers provide an output of the test pattern at terminals 108, 110, and 112 to be fed into the test apparatus 114 along with the test pattern from output 104 that has been held in the test apparatus. Thus, it can be readily seen that the test pattern applied to the terminal inputs 22, 24, 26, 28 and 30 propagates through the combinatorial logic, including the parallel PLAs and linear logic function devices to perform the test and create an output which is shifted out onto line 104, and scanned out into the test apparatus 114 along with the other outputs at 108, 110, and 112 so that a comparison can be made. If what is shifted out compares with the expected output, then faults which can be detected with this one particular test pattern is not present.

DESCRIPTION OF THE PREFERRED EMBODIMENT

Figure 2:
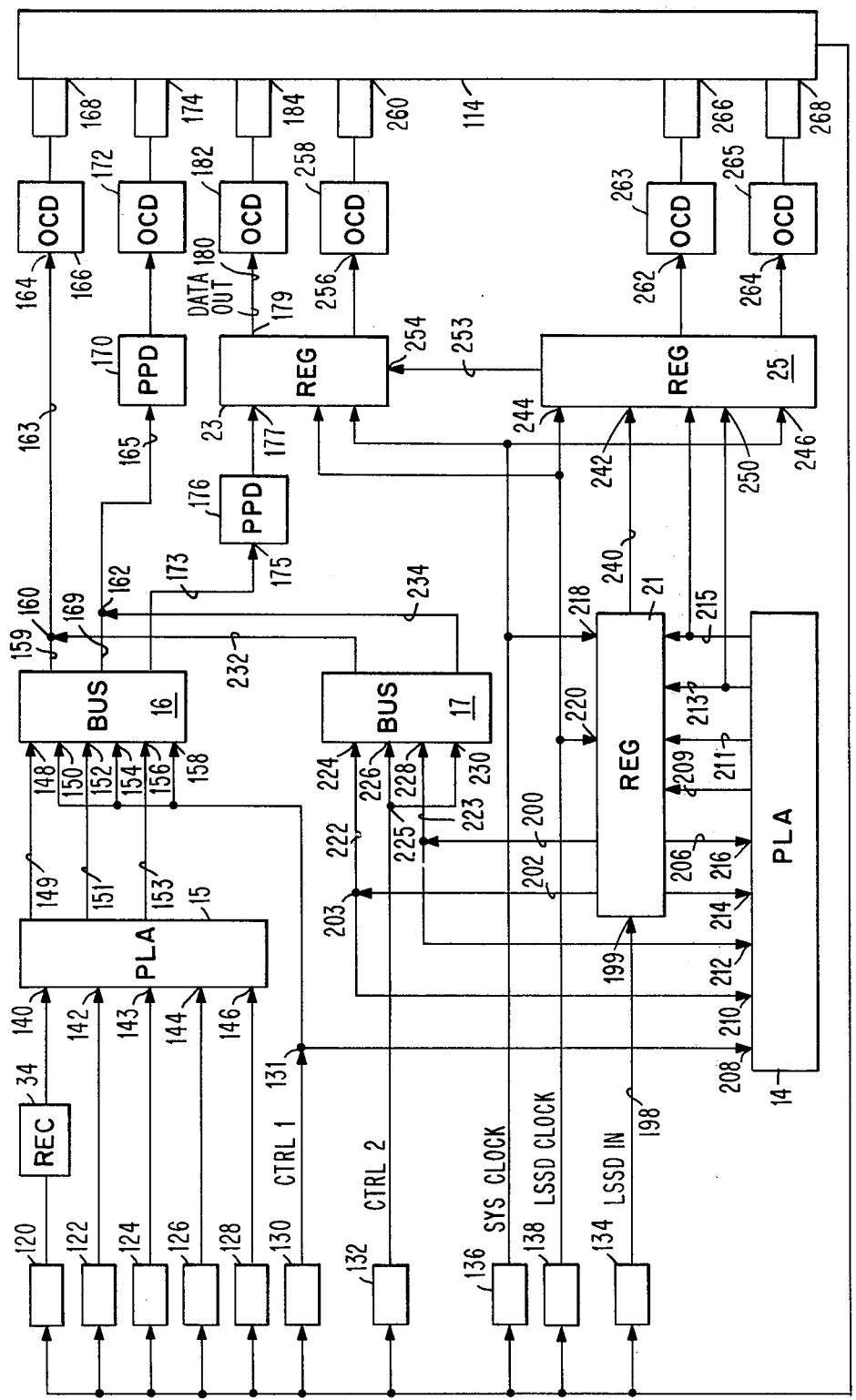
FIG. 2 shows a circuit with PLAs and busses arranged to be testable in a macro mode.

Referring to FIG. 2, an example of the preferred arrangement is shown for carrying out the invention. Not only is the structural diagram in FIG. 2 more detailed than in FIG. 1, the components are arranged differently. For example, two PLAs, 14 and 15, are shown in FIG. 2, whereas three PLAs 10, 12, and 14 are shown in FIG. 1. However, only PLA 14 finds similarity in the two figures. Also, two busses 16 and 17 are shown in FIG. 2, whereas only one bus 16 is shown in FIG. 1, with the respective busses 16 in the two figures being substantially the same. Thus, it will become apparent that the combinatorial logic being tested in FIG. 2 is composed of the two PLAs 14 and 15, busses 16 and 17, receiver 34, push-pull drivers 170 and 176, registers 21, 23, and 25, and off-chip drivers 166, 172, 182, 258, 263, and 265. It is to be noted that registers 21, 23, and 25 contain latches connected to form LSSD shift registers in the manner described by the Eichelberger U.S. Pat. Nos. 3,783,254 and 3,761,695.

In order to test PLA 15, input terminal pads 120, 122, 124, 126 and 128 receive the test pattern in parallel fashion from the test apparatus 114. While input terminal pad 120 is connected to a receiver 34, whose output is connected to PLA 15 at terminal 140, the remaining input terminals 122, 124, 126 and 128 are connected directly to PLA 15 through input terminals 142, 143, 144 and 146.

PLA 15 provides three data outputs on lines 149, 151, and 153 to the terminals 148, 152 and 156 on bus 16. The input on pad terminal 130 provides a control signal at terminals 150, 154, and 158 to permit the bus 16 to perform an AND function and provide an output to lines 159, OR dot 160, and onto 163, to put a signal on terminal 164 of off-chip driver 166 which provides an output to output pad terminal 168 connected to test apparatus 114. The OR dot is the connection of two lines performing a logic OR function of this embodiment. Also, the ANDed input at terminal 152 propagates through bus 16 to provide an output on line 169 to OR dot 162, line 165 through push-pull driver 170, to provide an input to off-chip driver 172 which, in turn, provides an output at output terminal pad 174 for feeding into test apparatus 114. Similarly, the control input at terminal 158 causes the input on terminal 156 to propagate through the bus 16 to provide an output on line 173, which feeds into terminal 175 of push-pull driver 176. This, in turn, provides an input to terminal 177 of register 23 which, in turn, under conditions to be hereinafter explained, provides a data output on line 180 to off chip driver 182 to an output terminal pad 184 for passing into test apparatus 114.

In this example of a preferred embodiment register 21 and PLA 14 operate in parallel. Input terminal pad 134 provides a means for applying serially the test pattern generated for PLA 14 onto the LSSD-IN line 198 for input into register 21 on input terminal 199. It is to be noted that the test pattern for PLA 14 not only tests the PLA, it also provides an input test pattern to bus 17. Thus, when the test pattern fills register 21, the LSSD clock provides an input on input terminal pad 138 to produce an output signal which is the contents of register 21 onto lines 200, 202, 204, and 206. It is to be noted that the output signal on lines 200 and 202 also provide input signals on lines 222 and 223 for input into bus 17. Thus, when a control signal is placed onto input terminal 132, terminals 224 and 226 are ANDed to provide an output on line 232 to OR dot 160. In a similar fashion, the control signal from input terminal pad 132 provides a signal at terminal 230 to AND with the signal on terminal 228 to provide an output signal on line 234 to OR dot 162. As will be hereinafter explained the value of the input (zero or one) on terminal pads 130 and 132 will determine which one has the controlling value so as to determine whether the information from register 21 or the information from PLA 15 will be passed through the OR dots 160 and 162. Thus, since bus 16 and bus 17 perform a NOR function, if the input to terminal pad 130 is a one and the input to terminal pad 132 is a zero, bus 16 will be blocked and its output will be a zero, and bus 17 will be open so as to permit the contents on lines 232 and 234 to pass through the OR dots 160 and 162 onto lines 163 and 165 respectively and out to terminal pads 168 and 174 into testing apparatus 114. On the other hand, if the signal on terminal pad 130 is zero, and the input terminal 132 is a one, bus 17 will be blocked and bus 16 being in an open mode, information will pass out to lines 159 and 161 and through OR dots 160 and 162 to terminal pads 168 and 174 to testing apparatus 114. p Simultaneously, with the testing of bus 17, the test pattern on lines 200, 202, 204, and 206 pass into terminals 208, 210, 212, 214 and 216 of PLA 14. The test pattern propagates through PLA 14, and generates a response on lines 209, 211, 213, and 215 for passage into register 21 upon a system clock pulse on input terminal pad 136 and applied to terminal 218 of register 21.

Through clock pulses at 138, the contents will be propagated onto line 240 for entrance into register 25 at terminal 242. In order to propagate the response stored in register 21, clock pulses are applied to the LSSD and system clocks 138 and 136, respectively, in a manner taught by the Eichelberger patents. Through this operation the pattern propagates along line 240 through register 25, and then along line 253 through register 23 to provide an output on line 180 for providing an output to off-chip driver 182 and on output terminal 184 into test apparatus 114.

TEST PATTERN GENERATION

In generating a test pattern for the specific circuit arrangement of FIG. 2, the first step is to use the personality for the PLAs which describe their logic function. The test patterns for the PLA macros are derived from the PLA personality. In this example, the personality for PLA 14, in FIG. 3, is that of a counter consisting of NOR circuits.

Figure 3:
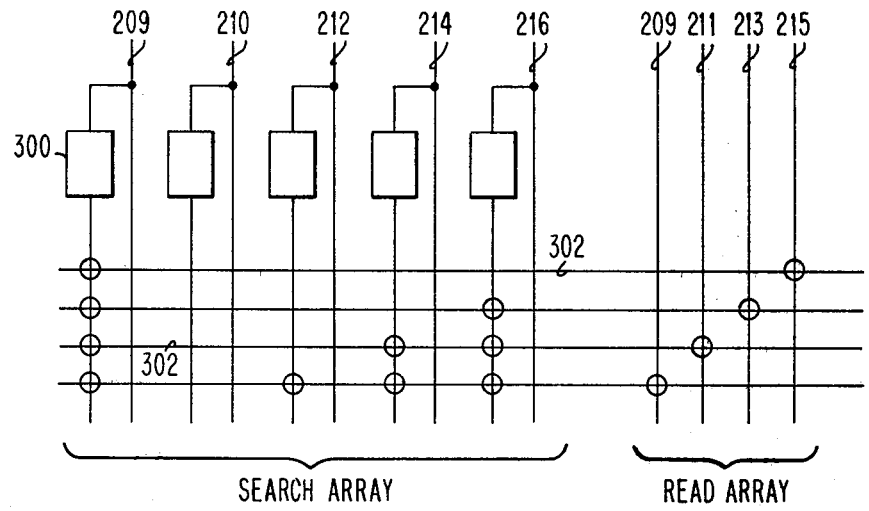
FIG. 3 shows the structure of a typical counter.

Reference is made to FIG. 3 which shows the personality of PLA 14. The inputs are designated as 208, 210, 212, 214, and 216. The outputs are designated as 209, 211, 213, and 215. Each input line in FIG. 3 is split into two lines, with one of the lines being connected to an inverter 300. PLA 14 has 4 word lines 302. The personality of the PLA 14 is established by placing an FET device at preselected personality crosspoints indicated by a circle.

Figure 4:
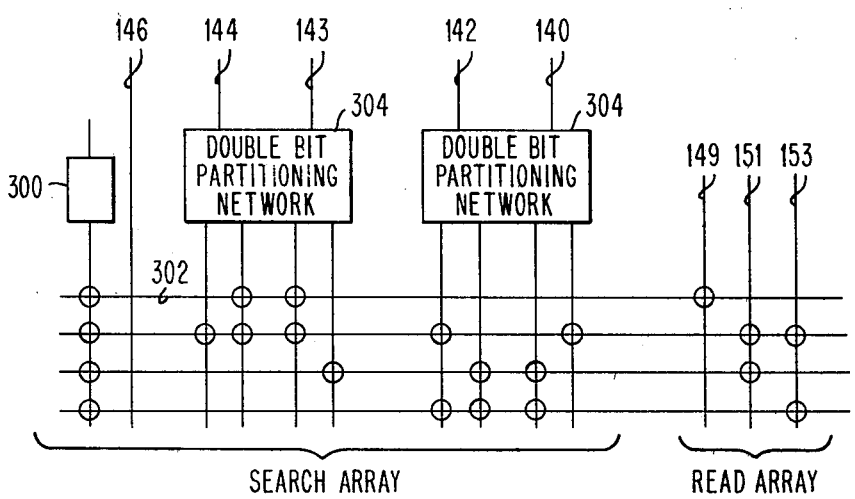
FIG. 4 shows the structure of a typical adder.

The personality of PLA 15 is that of an adder consisting of NOR circuits, shown in FIG. 4 where the inputs are designated as 140, 142, 143, 144 and 146. The outputs are designated as 149, 151, and 153. Two input lines each are combined in double bit partitioning network 304. The partitioned bit lines entering the array from the bit partitioning network are connected at personalized crosspoints by FET devices to the word lines 302 as indicated by circles. These connected crosspoints represent the personality for PLA 15. For more detail of the above, reference is made to the paper entitled, "Optimized Stuck Fault Test Pattern Generation for PLA Macros," by E. I. Muehldorf and T. W. Williams, in the Digest of Papers, LSI Test Symposium, presented at Cherry Hill, N. J., October, 1977.

Using the above personalities for PLAs 14 and 15, the patterns shown in the following Tables I and II are derived by applying a well-known algorithm as shown and described in the aforementioned paper by Muehldorf and Williams entitled, "Optimized Stuck Fault Test Pattern Generation for PLA Macros," Digest of Papers, October, 1977, LSI Test Symposium, pp. 89–101. The derivation of the test patterns themselves form no part of this invention, it being well-known in the art how this is accomplished. However, as noted above and in FIGS. 3 and 4, (a) both the SEARCH and READ arrays consist of NOR circuits, (b) at the output of PLA 14 there are inverters which are an integral part of PLAs 14, and (c) there are no inverters at the output of PLA 15.

TABLE I

Pattern Set for PLA 14

| 2 | 2 | 2 | 2 | 2 | 2 | 2 | 2 | 2 |
|---|---|---|---|---|---|---|---|---|
| 0 | 1 | 1 | 1 | 1 | 0 | 1 | 1 | 1 |
| 8 | 0 | 2 | 4 | 6 | 9 | 1 | 3 | 5 |
| 1 | — | 1 | 1 | 1 | 1 | 1 | 1 | 1 |
| 0 | — | 1 | 1 | 1 | 0 | 0 | 0 | 0 |
| 1 | — | 1 | 1 | 0 | 1 | 0 | 0 | 0 |
| 1 | — | 1 | 0 | 1 | 1 | 1 | 0 | 0 |
| 1 | — | 0 | 1 | 1 | 1 | 1 | 1 | 0 |

| Pattern | Expected Response |
|---|---|

Note:
Input 210 has a "don't care" condition, i.e., its value can be arbitrarily chosen.

TABLE II

Pattern Set for PLA 15

| 1 | 1 | 1 | 1 | 1 | 1 | 1 | 1 |
|---|---|---|---|---|---|---|---|
| 4 | 4 | 4 | 4 | 4 | 4 | 5 | 5 |
| 6 | 4 | 3 | 2 | 0 | 9 | 1 | 3 |
| 1 | 1 | 1 | 0 | 0 | 0 | 1 | 1 |
| 1 | 1 | 1 | 1 | 1 | 0 | 1 | 0 |
| 1 | 0 | 0 | 1 | 0 | 0 | 1 | 1 |
| 1 | 1 | 0 | 0 | 1 | 1 | 1 | 1 |
| 1 | 1 | 1 | 1 | 0 | 0 | 0 | 0 |
| 1 | 0 | 1 | 1 | 0 | 1 | 1 | 1 |
| 1 | 1 | 0 | 0 | 0 | 1 | 0 | 1 |
| 1 | 0 | 1 | 1 | 1 | 1 | 0 | 0 |
| 1 | 0 | 1 | 1 | 1 | 1 | 0 | 0 |
| 1 | 1 | 1 | 0 | 1 | 0 | 0 | 0* |
| 0 | 0 | 0 | 1 | 1 | 1 | 1 | 1* |

| Pattern | Expected Response |
|---|---|

*There is an arbitrary choice involved in picking these patterns.

TABLE III

Tests for the Partition Containing PLAs 15 and 14

| | 1 | 2 | 3 | 4 | 5 | 6 | 7 | 8 | 9 | 10 | 11 | 12 | | 13 | 14 | 15 | 16 | 17 | 18 | 19 | 20 |
|---|---|---|---|---|---|---|---|---|---|---|---|---|---|---|---|---|---|---|---|---|---|
| PLA 15 Input Pattern | | | | | | | | | | | | | | | | | | | | | |
| PAD 128 | 1 | 1 | 1 | 1 | 1 | 1 | 1 | 1 | 1 | 0 | 0 | 0 | | | | | | | | | |
| PAD 126 | 1 | 1 | 0 | 1 | 1 | 0 | 1 | 0 | 1 | 0 | 1 | 1 | | | | | | | | | |
| PAD 124 | 1 | 1 | 0 | 0 | 1 | 1 | 0 | 1 | 1 | 0 | 1 | 1 | | | | | | | | | |
| PAD 122 | 0 | 1 | 1 | 0 | 1 | 1 | 0 | 1 | 0 | 1 | 0 | 0 | | | | | | | | | |
| PAD 120 | 0 | 1 | 0 | 1 | 0 | 0 | 0 | 1 | 1 | 1 | 1 | 1 | | | | | | | | | |
| PAD 132 | 1 | 1 | 1 | 1 | 1 | 1 | 1 | 1 | 1 | 1 | 1 | 1 | | 0 | 0 | 0 | 0 | 0 | 0 | 0 | 1 |
| PAD 130 | 0 | 0 | 0 | 0 | 0 | 0 | 0 | 0 | 0 | 0 | 0 | 0 | | 1 | 0 | 1 | 1 | 1 | 1 | 1 | 1 |
| | | | | | | | | | | | | | | PLA 14 Input Pattern | | | | | | | |
| PAD 134 | | | | | | | | | | | | | | 1 | 1 | 1 | 1 | 0 | | | |
| | | | | | | | | | | | | | | 1 | 1 | 1 | 0 | 1 | 0 | 1 | 0 |
| | | | | | | | | | | | | | | 1 | 1 | 0 | 1 | 1 | 1 | 0 | 0 |
| PLA 15 Expected Output Pattern | | | | | | | | | | | | | | | | | | | | | |
| PAD 168 | 0 | 0 | 0 | 1 | 0 | 1 | 1 | 1 | 0 | 1 | 1 | 0 | | | | | | | | | |
| PAD 174 | 1 | 1 | 1 | 1 | 0 | 1 | 0 | 0 | 0 | 1 | 1 | 0 | | | | | | | | | |
| PAD 260 | 1 | 0 | 1 | 1 | 0 | 1 | 1 | 0 | 0 | 1 | 1 | 0 | | | | | | | | | |
| | | | | | | | | | | | | | | PLA 14 Expected Output Pattern | | | | | | | |
| PAD 266 | | | | | | | | | | | | | | 1 | 0 | 1 | 1 | 1 | | | |
| PAD 268 | | | | | | | | | | | | | | 1 | 0 | 0 | 1 | 1 | | | |
| | PLA 15 and Bus 16 Test | | | | | | | | | | | | Bus 16 | PLA 14 | | | | Bus 17 | | Bus 17 | |

TABLE III-continued

| Tests for the Partition Containing PLAs 15 and 14 | | | | | | | | | | | | | | | | | | | |
|---|---|---|---|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 | 17 | 18 | 19 | 20 |
| | | | | | | | | | | | Control S-A-O | | Test | | | Test | | | Control S-A-O |

When the test patterns for the PLA macros have been generated, they are assembled in a preliminary manner to provide the basis for fault determination. For purposes of this invention, a test pattern will be defined as a set of ones and zeros applied at one point in time as a stimulus across all primary inputs (PI) and pseudo primary inputs (PPI). Corresponding to each test pattern there will be an expected response pattern which can be sampled at one point in time across all pseudo primary outputs (PPO) and primary outputs (PO) for comparison purposes in the test apparatus 114.

As noted above, starting with the patterns given in Tables I and II, the test patterns for the partitioning under consideration are assembled as shown in Table III above.

Figure 5:
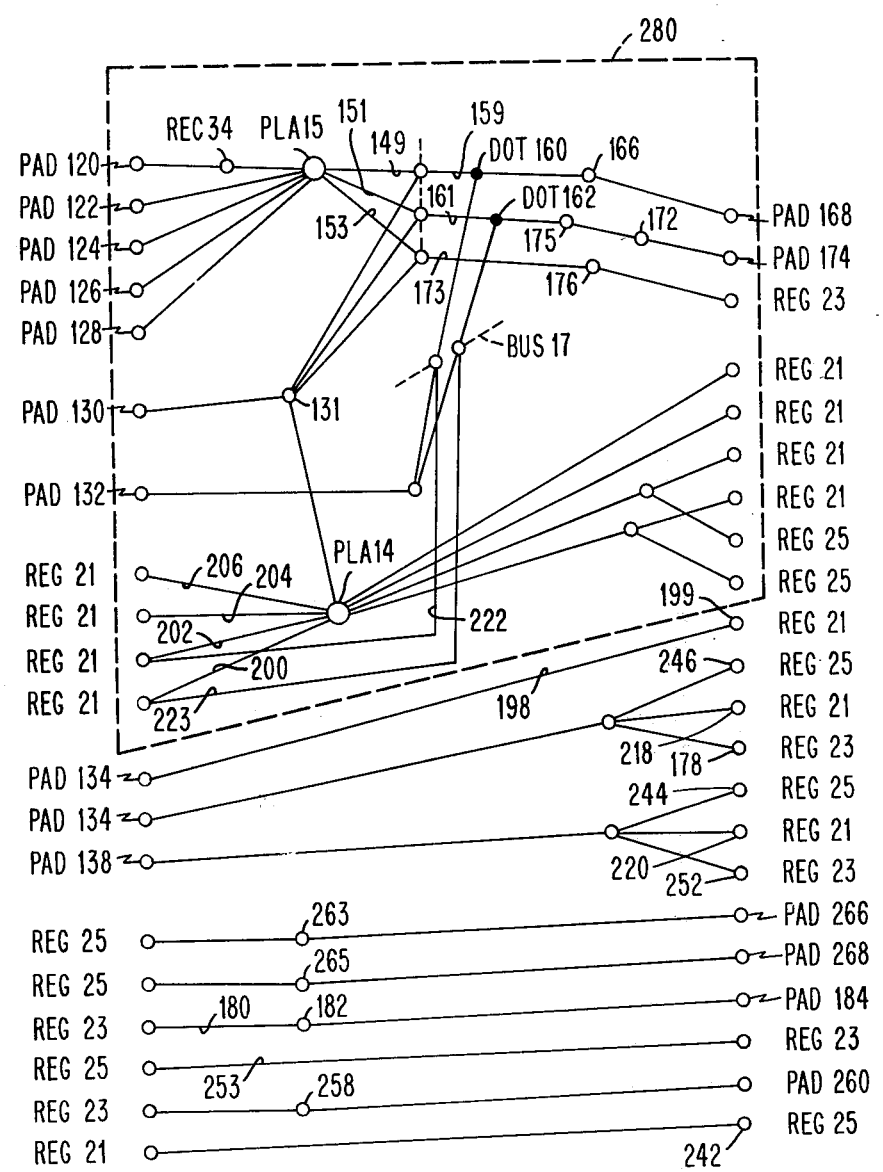
FIG. 5 shows the data path structure of the circuit of FIG. 2.

Reference is made to FIG. 5 which shows a plan diagram of the data and control signal paths through the circuit of FIG. 2. The left side of the figure shows the primary inputs on terminal pads 120, 122, 124, 126, 128, 130, 132, 134, 136 and 138 and pseudo primary inputs onto lines 200, 202, 204 and 206. The pseudo primary inputs emerge out of registers 21, 23 and 25. These pseudo primary inputs from register 21 emerge onto lines 200, 202, 204, 206, 222 and 223. The pseudo primary inputs out of register 23 emerge onto line 180 and off-chip drivers 182 and 258. The pseudo primary input from register 25 go onto line 253 and off-chip drivers 263 and 265. The right side of the figure shows the primary outputs on terminal pads 168, 174, 184, 260, 266, and 268, and pseudo primary outputs such as 199, 246, 218, 178, 244, 220, and 252.

An important feature of the invention is that the PLAs be connected so as not to have reconvergent fan-outs. For purposes of illustration a fan-in is where a plurality of inputs enter into a single node. For example, in FIG. 5 inputs on terminal pads 120, 122, 124, 126 and 128 feed into PLA 15. A fan-out is a situation where from a single node, a plurality of outputs emanate. Such an example is shown by control signal or terminal pad 130 into node 131 which fans-out into three inputs to bus 16 and one to PLA 14.

Now the importance of not having the fan-outs reconverge is to keep the PLAs mutually parallel and non-interferring (in a testing arrangement). If the fan-outs were to reconverge, as in the prior art techniques, test patterns may interfere and test results be obscured. As it was stated at the outset of the description of this invention no reconvergence is a constraint required for the PLAs to be testable in a much more efficient manner than by unit logic.

Reference is made to Table III, showing the generated tests for the partition containing PLAs 14 and 15 in FIG. 2. For the purpose of this invention, a partition is a section of circuitry where the data lines interconnect as shown on FIG. 5 at 280. Test patterns for PLA 15 are shown in columns 1-11 in Table III and are applied in sequence. For example, the pattern for PLA 15 shown in column 1 is applied to input terminal pads 120-128 in FIG. 2. The expected output pattern should be 011 as in column 1 of Table III. Likewise, the test pattern for PLA 14 is shown in columns 13-17. The test pattern for column 13 is applied to the input terminal pad at 134 for serially feeding into the register 21 as was done with respect to LSSD register 19 in FIG. 1 through scan-in terminal 22. The expected output pattern should be 111 as in column 13 of Table III.

The circuit shown in FIG. 2 is intended to cover most parallel PLA situations such as feeding serially into a bus 16 from PLA 15 and feeding in parallel into the bus 17 from PLA 15 with the PLA being tested simultaneously.

As noted from FIG. 5 and Table III, the inputs to PLA 14 and 15 cannot be applied in parallel, although there is no reconvergent fan-out, since the input to PLA 14 and 15 are independent of each other. However, there is a control input from pad 130 which provides input to PLA 14 and control to bus 16. When the control input is activating PLA 14, it will block bus 16 so as to avoid interference. On the other hand, when PLA 14 is blocked, bus 16 is activated and the signals from PLA 15 can pass through bus 16.

OPERATION

To begin the operation, the test pattern in column 1 of Table III is applied simultaneously to input terminal pads 120, 122, 124, 126 and 128, as shown in FIGS. 2 and 5. As can be seen in FIG. 2, only the inputs to pads 120, 122, 124, 126 and 128 pass into PLA 15. The test pattern then propagates through PLA 15 in performing the tests in PLA 15 and provides outputs on lines 149, 151 and 153 and enters into bus 16. The control signal on input terminal pad 130 provides an input to bus 16 for performing an AND function on the data inputs 148, 150 to provide an output to dot 160, which in turn directs an output to terminal 164 on off-chip driver 166 to provide a primary output at terminal 168 to be entered into a test apparatus 114 for comparison purposes.

The control inputs 152 and 154 are gated through the bus 16 to provide an output on line 161 to the OR dot 162 and provides an output to push-pull driver 170 through the off-chip driver 172 and provides an output on terminal pad 174 to the test apparatus. The inputs at 156 and 158 to bus 16 output onto line 173 and provide an input to push-pull driver 176 at terminal 175 to provide an output at terminal 177 into register 23.

It is to be noted that the pattern in column 1, in Table III, provided to terminal pads 120-128 of FIG. 2, should generate an expected response pattern as shown in the Table for PLA 15. Thus, the pattern in column 1 performs the test for PLA 15 and bus 16. If the expected response pattern comes out on terminal pads 168, 174, and 184, as shown for the output for PLA 15, then this pattern has not detected a fault in PLA 15. In similar fashion, the remaining patterns 2-11 are stepped through the circuit. When all responses are as expected, PLA 15 has no fault.

In order to perform a stuck at one test for lines 152, 154, and 156 for the control input to bus 16, a one is placed on terminal 130. The pattern 0,0,0, in column 12 of Table III is chosen for testing lines 149, 151 and 153. This is the bus control stuck at zero test.

The outputs on terminal 168 and 174 will arrive simultaneously and then held in the test apparatus 114 because the output on terminal 184 will be delayed due to being held in register 23 for a later time. Thus, the outputs on terminal 168 and 174 are shifted and retained until the output from terminal 184 appears. It is at this time that the three outputs (0,1,1) are compared with their expected outputs.

Having tested the data inputs (terminals 148, 152, and 156) of bus 16, to test the control inputs (terminals 150, 154, and 158) of bus 16, is a one is placed at input terminal pad 130 and a zero is received as the output, bus 16 is not faulty because a zero is what was expected.

Whereas PLA 15 and bus 16 were tested in a series relation, bus 17 is tested in parallel with PLA 14. Thus, whereas bus 16 had to be tested at a different point in time from the PLA 15, bus 17 is shown in parallel so that it can be tested simultaneously while testing PLA 14.

It is to be noted that register 21 also performs a logic function and is not included merely for the purpose of testing. The particular register 21 when used in combination with PLA 14 is actually a counter.

Simultaneously, with unloading the contents of register 21 into PLA 14, the contents also feeds into bus 17 through line 222 into terminal 224 in addition to line 223 into terminal 228. The control signal coming in on terminal 130 which controls bus 16 simultaneously controls PLA 14 by turning it on at input 208 so as to read out the test pattern after propagating through the PLA onto lines 209, 211, 213, and 215 for input into register 21. The input value (one) on terminal 132 turns bus 17 off. The control value (one) on terminal 130 conditions bus 16 on and PLA 14 off.

To test PLA 14, PLA 14 is activated on and register 21 and PLA 14 constitute a counter to step the pattern through its various functions. When shifting out the contents of register 21, the output pattern is also shifted out onto line 240 which feeds into terminal 242 of register 25, so as to pass the pattern out to terminal 254 of register 23 to provide an output of data on line 180, through off-chip driver 182 to provide an output on terminal 184. This represents a test for PLA 14.

It is to be noted that while the pattern on input terminals 120–128 are not in LSSD because enough pads are available, for testing PLA 14 only one terminal pad 134 is available and therefore the pattern is carried out in LSSD fashion. Therefore the outputs on pads 168 and 174 must be delayed for output 184 to make the comparison test.

To test bus 17, operating in parallel and simultaneously with PLA 14, the pattern in column 18 is entered and appears as an output on lines 232 and 234 to the dots 160 and 162 with the control signal on terminal 130 resulting in a noncontrolling value at dots 160 and 162 so as to disable the outputs on lines 159 and 161 and thus permitting the outputs of bus 17 to appear at off-chip drivers 166 and 172 and to output terminals 168 and 174. It is to be noted than since bus 17 test and PLA 14 test are independent, their outputs need not be stored waiting for outputs from the other pads in the test apparatus but can be tested immediately.

Referring to Table III, since the bus 17 test patterns and PLA 14 test patterns are carried on in parallel and done independently, the test identified as bus 17 test in column 20 can be eliminated and instead the test pattern at column 14 can be simulanteously used for the bus test and the PLA 14 test because they are both at zero states.

In order to test the control inputs 226 and 230 to bus 17 for stuck at zero fault, a one is placed at control input 132 to enter bus 17 at terminals 226 and 230. Simultaneously, the inputs at terminals 150, 154, and 158 of bus 16 are placed at a controlling value, which produces a zero at lines 159 and 161. Thus, terminals 226 and 230 can be tested for stuck at zero fault by feeding the output to lines 232 and 234 respectively and then propagating out to terminal points 168 and 174.

After the pattern in column 13 is fed into terminal 134 and line 198 to register 21, the LSSD clock pulse from terminal 138 signals the register to transfer its contents onto lines 200, 202, 204, and 206. Simultaneously, an output is also provided on line 240 to enter register 25 at terminal 242. On the next clock pulse from LSSD clock 138, an input is provided at terminal 244 in register 25 to provide an output to register 23 at terminal 254 to propagate through register 23 via line 180 to pad 184.

To test the off-chip drivers 263 and 265, when the output pattern for PLA 14 appears on lines 209, 211, 213 and 215 for propagation into register 21, simultaneously signals appear on line 221 and 222 for feeding into terminals 248 and 250 of register 25. Register 25 also supplies inputs to off-chip drivers 263 and 265. These can be tested by the signal being shifted through register 25. Upon the next system clock pulse at input terminal 136, an input signal is provided at terminal 246 of register 25 to provide an output on terminal input 262 to off-chip driver 263 to provide an output at terminal 266. Simultaneously, an output is provided at terminal 264 of off-chip driver 265 to likewise provide an output on terminal 268. The values on output terminals 266 and 268 are combined with the other outputs in the testing apparatus 114 to compare as an output pattern against the expected output pattern.

In addition, by arranging the busses and the PLAs in the manner described above, the PLAs can be tested in parallel provided if there is an input fan-out, there is no output dotting. On the other hand, if there is output dotting, there must not be input fan-out. It is only under these conditions that the patterns will not interfere.

It is noted that for the example of the preferred embodiment of the invention in FIG. 2, the value of the input at terminal pad 132, as an input to bus 17, must be non-controlling to make the pattern for PLA 14 compatible with PLA 15, i.e., the input to terminal pad 132 must be a zero as shown in columns 13–17. Thus the patterns cannot be carried out in parallel because they would interfere. However, for one skilled in the art it will become apparent that when the two PLA patterns do not interfere the patterns can be combined in operating in parallel.

By arranging the PLAs and the busses in the manner described above, testing embedded PLAs is much simpler than resorting to primitives (testing in a unit logic mode), and saves tremendously on test pattern generation.

It will be evident to anyone skilled in the art that in FIGS. 1 and 2 the PLA can be substituted for by any general macro performing a non-linear logic function, such as, a general arithmetic logic unit, or a general control logic unit. Similarly, a logic macro that performs a linear logic function can be substituted for the busses to perform the one-to-one mapping.

While the invention has been particularly shown and described with reference to the preferred embodiment thereof, it will be understood by those skilled in the art that the foregoing and other changes in form and detail may be made therein without departing from the spirit and scope of the invention.

Having thus described our invention, what we claim as new, and desire to secure by Letters Patent is:

1. In a testable LSI chip having embedded PLAs and linear logic function devices mounted thereon, the improvement comprising:
   a plurality of PLAs connected by means of selectively switchable gates, in alternate parallel paths with their inputs not connected together when their outputs are connected together;
   a linear logic function device connected in series with at least one of said PLAs; and
   whereby the PLAs are testable for faults in a macro mode.

2. In a testable LSI chip with embedded PLAs and linear logic function devices mounted thereon, the improvement comprising:
   a plurality of PLAs connected by means of selectively switchable gates, in alternate parallel paths with their outputs not connected together when their inputs are connected together;
   a linear logic function device connected in series to at least one of said PLAs; and
   the PLAs being testable for faults in a macro mode.

3. In an LSI chip having a plurality of PLAs, at least a first PLA having inputs connected to the output of a shift register and the output of the PLA connected to the input of the shift register, the output of the shift register being connected to a testing apparatus external to the chip, the improvement comprising:
   at least a second PLA in alternate parallel path relation to said first PLA and having its output connected to at least a first bus, the output of the bus being connected to the testing apparatus;
   at least a second bus connected to the output of the shift register;
   the outputs of the busses being connectable to one another;
   control means connected to both said first and second busses for disabling the output of one of the busses to permit the output of the other bus to propagate through to the testing apparatus, and
   whereby the PLAs, shift register, and busses are testable in a macro mode.

4. In an LSI chip having a plurality of PLAs, the improvement comprising:
   a first shift register;
   at least a first embedded PLA having inputs connected to parallel outputs of the shift register;
   a second shift register;
   at least a second embedded PLA, connected in alternate parallel path relation with the first PLA, having inputs connected to the parallel outputs of said second shift register;
   a gated bus having inputs connected to the outputs of both the first and second PLAs;
   an external test apparatus connected to the inputs of said first and second shift registers for inputting a test pattern into said shift registers;
   control means connected to the bus to simultaneously enable testing the PLAs and bus by propagating said test pattern through the PLAs and bus; and
   said test apparatus receiving the output of said gated bus for comparison with the expected output.

5. In a macro testable LSI chip having a combinatorial logic structure arrangement embedded in the LSI chip including:
   an LSSD shift register for receiving a test pattern from an external test apparatus output;
   a first PLA connected to the output of the shift register for receiving the test pattern;
   the output of the first PLA connected to the input of the shift register to feed back the test pattern to the output of the shift register;
   linear logic function means connected to the output of the shift register for receiving and propagating the test pattern therethrough;
   at least a second PLA connected in an alternate parallel path with the first PLA without reconverging fan-outs for receiving a test pattern simultaneously with the first PLA;
   the linear logic function means including a first bus connected in series with one of said PLAs between said test apparatus output and a chip output node, and a second bus connected in parallel with the other of said PLAs between said test apparatus output and a chip output node;
   control means for disabling one of said bus means to permit propagation of the test pattern therethrough; and
   said test apparatus including an input for receiving the test patterns from said chip output node for comparison purposes.

6. In an efficiently testable LSI chip, the improvement comprising:
   a first PLA for receiving a test pattern from an external test pattern generator connected thereto;
   an LSSD latch register connected to the input and output of said first PLA to feed the test pattern to said first PLA for propagation therethrough and to receive the resultant output from said first PLA for scan-out to said external test apparatus;
   a second PLA having its inputs connected in common with the inputs of said first PLA to receive a test pattern for propagating therethrough simultaneously with said first PLA; and
   linear logic function means connected in series to the output of each of said PLAs for providing the output test pattern to said external test apparatus for comparison with the expected output.

7. In an efficiently testable LSI chip, the improvement comprising:
   a first PLA for receiving a test pattern from an external test pattern generator connected thereto;
   an LSSD latch register connected to the input and output of said first PLA to feed the test pattern to said first PLA for propagation therethrough and to receive the resultant output from said first PLA for scan-out to said external test apparatus;
   a second PLA having its inputs connected in common with the inputs of said first PLA to receive a test pattern for propagating therethrough simultaneously with said first PLA; and
   linear logic function means connected in series to the output of each of said PLAs for providing the output test pattern to said external test apparatus for comparison with the expected output.

* * * * *